(12) United States Patent
Ngoi et al.

(10) Patent No.: US 6,307,799 B1
(45) Date of Patent: Oct. 23, 2001

(54) ACOUSTO OPTIC DATA STORAGE SYSTEM ON A STATIONARY AND HIGH DENSITY DATA STORAGE MEDIA

(75) Inventors: Bryan Kok Ann Ngoi; Krishnan Venkatakrishnan, both of Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 09/204,555

(22) Filed: Dec. 3, 1998

(51) Int. Cl.[7] .................................................. G11C 13/04
(52) U.S. Cl. ........................ 365/215; 365/234; 369/100; 369/109; 369/110; 369/111; 369/112; 369/116; 369/275.3; 369/275.1
(58) Field of Search ..................... 369/100, 109, 369/110, 111, 112, 116, 275.1, 275.3; 365/215, 234, 216

(56) References Cited

U.S. PATENT DOCUMENTS

| | | | |
|---|---|---|---|
| 4,550,249 | 10/1985 | Damen et al. ...................... 250/201 |
| 4,918,679 | 4/1990 | Opheij et al. ...................... 369/44 |
| 5,740,148 | * 4/1998 | Ja ...................................... 369/112 |

* cited by examiner

*Primary Examiner*—Andrew Q. Tran
(74) *Attorney, Agent, or Firm*—Burns, Doane, Swecker & Mathis, LLP

(57) ABSTRACT

A miniaturized stationary optical storage system capable of reading and writing data on an optical storage media is disclosed. In the disclosed invention, the disk is held stationary and the beam is made to scan on both the axes by using an acousto optic technique. The preferred embodiment has a technique of obtaining parallel scanning beam, which is focused on to the optical storage media and the photo detector receives the reflected beam carrying the optical signal. The system has the capability of reading as well as writing on the optical storage media by using the same source or different source. The preferred embodiment also utilizes square as well as circular optical storage media of reduced size, which is achieved, by adopting smaller spot size and higher scanning resolution. The method of magnifying the scan angle of the scanning beam from the acousto optic deflector is also disclosed. The alternative embodiment utilizes phase shifting for reading the signal rather than the intensity of the signal.

19 Claims, 17 Drawing Sheets

ACOUSTO OPTIC DATA STORAGE SYSTEM ON A STATIONARY AND HIGH DENSITY DATA STORAGE MEDIA

BACKGROUND OF THE INVENTION

Information storage and retrieval is one of the major challenge faced in the past few decades. The challenge is to reduce the size of the data storage media and to increase the access time or data retrieval time. Although technical advancement has been made for the past few years, the mechanical motion of the disk and the optical head assembly using actuator mechanism imposes limitation on the size and density of the optical storage media. The mechanical rotation of the disk results in the wobbling effect of the rotating disk, which accumulates the tolerance limit. Thus a limitation is set on the size and the density of the storage media. Also, the resolution of the actuator movement limits the size and density of the storage media. Moreover, the mechanical movement of the disk and the actuator results in additional problems such as focusing error and tracking error. Therefore, the servo system becomes quite complicated since a feed back signal is required to compensate for tracking and focusing error. Due to limitation set in the resolution of the actuator and the wobbling effect of the rotating disk, it is not possible to reduce the spot size, the distance between the tracks and pitch size in the data storage media.

U.S. Pat. No. 4,550,249 discloses a method of deflecting the beam by using a mirror rather than moving the entire head assembly. The system includes an array of lenses, and each lens focuses the beam at least to one track. This array of lenses covers a substantial portion of the recording media and the deflecting mirror directs the beam onto the desired lens. The system is quite complicated in its design of making an array of lenses and also the means of deflecting the beam using a mirror leads to poor resolution. The error in the system will increase at higher scanning rate due to the vibration on the scanning mirror.

U.S. Pat. No. 4,918,679 discloses an apparatus by which grating is employed for deflecting the beam. The wavelength of the incident beam is varied to change the deflection angle of the diffracted beam from the grating. This system shows an alternative way of positioning the beam to the desired track by producing a tracking error signal.

In order to minimize the size of the disk without compromising on the storage capacity of the optical storage media the resolution of the beam movement should be increased and the wobbling effect of the disk should be minimized. Both the above mentioned facts can be minimized to the maximum limit by making the optical storage media stationary and involving non-mechanical scanning of beam.

Since the control system works in conjunction with reading and writing the data, the simplification of the control system by eliminating or minimizing the focusing and tracking error will maximize the access rate of the data storage media.

Another limitation imposed on the present system is to read as well as record data using the same optical storage system rather than individual one. Further, the system is complicated due to the fact that the beam spot size and power of the beam is not the same for read and write system.

SUMMARY OF THE INVENTION

The present invention discloses a method of reading and writing data on a stationary optical storage medium by applying acousto optic scanning technique for scanning the beam on the surface of the stationary storage media.

The first preferred embodiment of the present invention discloses an optical layout of reading the data from the optical storage system, which is held stationary. The method of scanning the beam using two acousto optic deflector for scanning in two axes is disclosed. The beam from the source is reduced in diameter by a beam reducing technique and is scanned by the acousto optic deflector. A technique of collimating the scanned beam to make the scanning beams parallel to each other is described whereby the scanning beam strikes the stationary optical storage medium perpendicular to the reading surface. The beam is thus reflected back in the same path and is captured by the photo detector, which retrieves the stored data based on the intensity of the signal.

The first embodiment of the present invention also discloses the method of writing the data on the optical storage medium by using the same or different laser source on the same optical path. Further modification in the present embodiment involves the introduction of method for increasing the scan angle of the beam to enable its application for large area storage media. This system comprises a combination of lens of varying focal length.

The second embodiment of the present invention includes the application of scanning lens for reducing the spot size of the laser beam on the optical media. The system includes a beam expander rather than a beam reducer as in the first embodiment. The scanning beam strikes the scanning lens normal to its optical axis and the scanning lens focuses the beam onto the optical media to a small spot size nearly normal to its surface. The system can be modified for reading as well as writing by varying the combination of laser source and the beam expansion ratio or also by applying the same source and beam expander which has flexibility of varying the beam intensity and expansion ratio, respectively.

The third embodiment of the present invention includes the application of scanning lens of different operating principle compared to the second embodiment. Here the scanning beam strikes the scanning lens at an angle depending on the scanning point and the scanning lens employed deflect the beam such that the beam focuses on to the recording media and scans nearly normal to its surface. The system reduces the number of optical components employed in the optical layout there by reducing the error involved in the system. The system also involves a beam expander to expand the beam size in order to reduce the beam spot size on the optical recording media.

The system can be further modified for reading as well as writing by using a different beam source and beam expander or the same having capability of varying the intensity of the laser beam and the expansion ratio of the beam expander.

In all the embodiments of the present invention the size of the optical storage media can be reduced by employing a high-resolution beam scanning, a beam of smaller spot size and a stationary storage media. Also, the modification of the shape of the optical storage media to square and circular shape is disclosed. The nature of scanning on the storage media, linear or circular or spiral manner depending on the shape of the disk, is disclosed.

The fourth embodiment of the present invention is the employment of phase shifting technique for reading the data from the storage media rather than by reflected beam intensity. The optical layout for the modified system on employing phase shifting technique for reading data is disclosed.

The need for tracking system can be eliminated since the phase shifting technique can replace the tracking technique available. Other scanning method such as PZT scanning can be employed but the resolution and the scan angle is limited.

DETAILED DESCRIPTION OF THE INVENTION

Figure 1A:
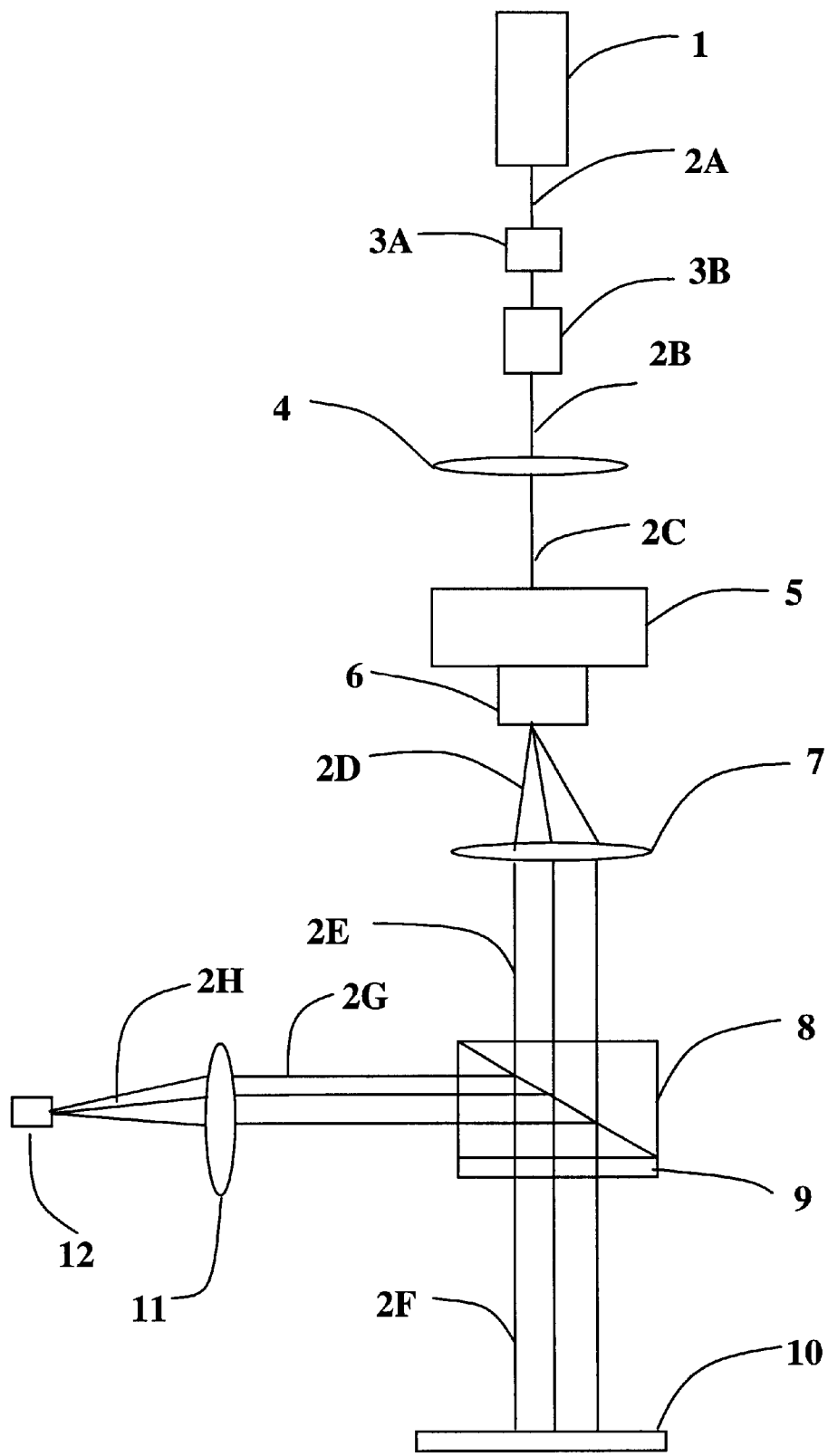
FIG. 1A is a drawing showing the optical layout of the system for reading data from a stationary optical storage medium for the first embodiment of the present invention.

Referring to FIG. 1A, the optical beam 2A is emitted from the source 1, which is preferably a light or laser beam. The source preferably emits fine collimated laser beam of linear polarization. The beam is filtered on passing through a spatial filter 3A. The purpose of the spatial filter is to improve the beam quality. The filtered beam is reduced in size on passing through preferably a beam reducer 3B. The beam reducer reduces the beam size to the desired size using a combination of preferably collimating or focusing optics. The reduced beam 2B passes through a lens 4, which is preferably of a collimating type. The beam 2C is thus focused on to the acoustic crystal in the acousto optic deflector 5 and 6. The scanning beam 2D obtained on passing through the acousto optic deflector is made to pass through the lens 7, which is preferably of collimating type and is of preferably the same specification as that of the lens 4. This process will probably generate parallel-scanning beams at all deflection angle from the acousto optic deflector. The parallel scan beam 2E preferably pass through beam splitter 8, which is preferably a polarization beam splitter. Also a wave plate 9 is fixed on to the beam splitter or in front of it, the Wave plate being preferably a quarter wave plate in nature. The beam 2F preferably strikes the stationary disk 10 at an angle perpendicular to the axis of the disk at all scan angled of the deflector and is reflected back. The reflected beam preferably passes through the same optical component 9 and 8 which changes the polarization state of the beam deflects the beam in another direction. The deflected beam 2G passes through a focusing optics 11, which is preferably of collimating type, and is focused on to the photo detector 12, which is preferably of array type or wide window type. In the current system the disk remains stationary and the laser beam is made to rotate at a preset speed to read the data.

The source 1 preferably emits fine collimated light of linear polarization is of preferably in the wavelength range from 550 nm to 750 nm. A diode laser can be also alternatively applied for the purpose. The laser source may preferably emit a laser beam of small or large beam diameter depending on the combination of optical component in the system. The beam reducer employed in the system may preferably made by combination of lens of different focal length, thus reducing the beam diameter to the requirement.

Figure 2:
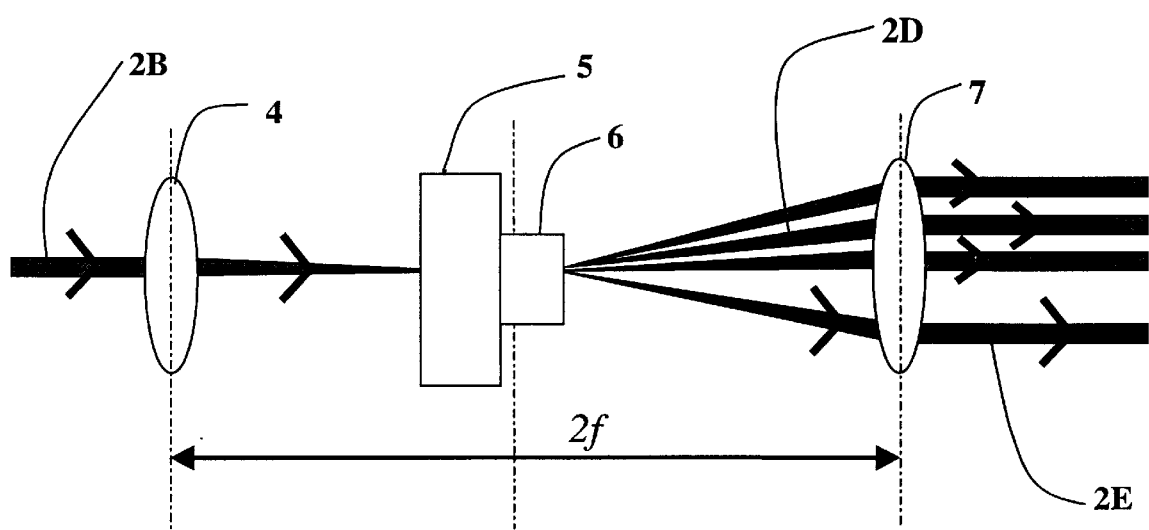
FIG. 2 is a drawing showing the technique of generating parallel collimated scan beams from the acousto optic deflector by combination of lens for the preferred embodiment of the invention.

Referring to FIG. 2 the lens 7 preferably be of collimating type, placed at a distance of twice the focal length from the lens 4, which is of the same specification as that of the lens 7. This process will produce collimated scan beams, which is of the same beam diameter as that of the input beam. The larger the focal length of the lens 4 and 7 the larger will be the scans length. But when the focal length of the lens 7 is larger than the focal length of the lens 4, the systems acts also as a beam expander, which may be essential to reduce the beam spot size using a scan lens. The parallel scanning beam of minimum divergence is made to strike the disk 10 perpendicular to the wide surface of the disk so that the beam is reflected back from the disk 10 in the same optical path. The system can also act as a beam reducer when the lens 4 is of longer focal length compared to the lens 7. Here the lens 4 and 7, are separated by a distance equal to the sum of the focal length of the lens 4 and 7. The longer the focal length of the lens 4 and shorter the focal length of the lens 7, the smaller will be the beam size. In this case the need for the beam reducer 3 is eliminated. But the system will eventually may result in the reduction of scan length and may preferably require a larger scan angle acousto optic deflector.

Figure 1B:
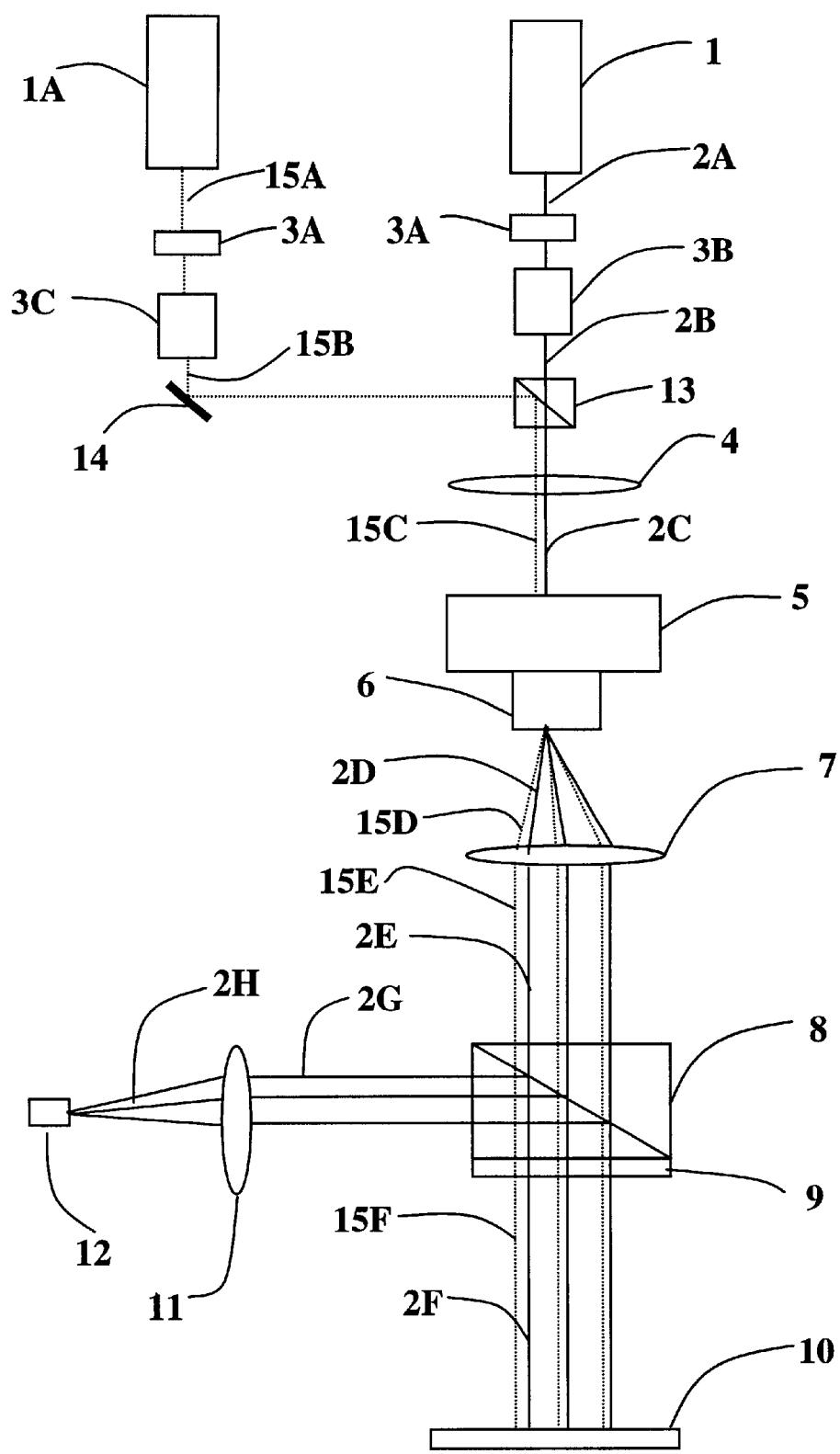
FIG. 1B is a drawing showing the optical layout of the system for reading and writing data from a stationary optical storage medium for the first embodiment of the present invention.

Further modification of the preferred embodiment is the capability of the system to act as a read as well as write data storage system as shown in FIG. 1B. The system includes a writing light source 1A, preferably of the same wave length as that of the reading light source 1 but of higher power compared to light source 1 depending on the power and beam spot size required to write on the disk. The beam reducer 3C may preferably be of higher beam reducing power compared to that of beam reducer 3B. The beam 15A from the light source 1A is orthogonal polarized compared to the beam from the light source 1. Otherwise a wave plate, preferably a half wave plate is placed in optical lay out of the write beam before the beam splitter 13. The write beam 15A then passes through a spatial filter 3A and then through the beam reducer 3B leading to reduced beam 15B, which is deflected by the plane mirror 14 on to the beam splitter 13, which is preferably a polarization beam splitter. Thereafter the beam takes the same optical path as that of the reading beam from the light source 1 and strikes the disk surface to record the information on to the disk. The need for separate light source can be eliminated if the light source has the capacity of switching the beam power to two different modes, i.e., one mode for writing of higher light power and another mode for reading of comparatively lower beam power. Also common beam reducer can be employed.

Figure 4A:
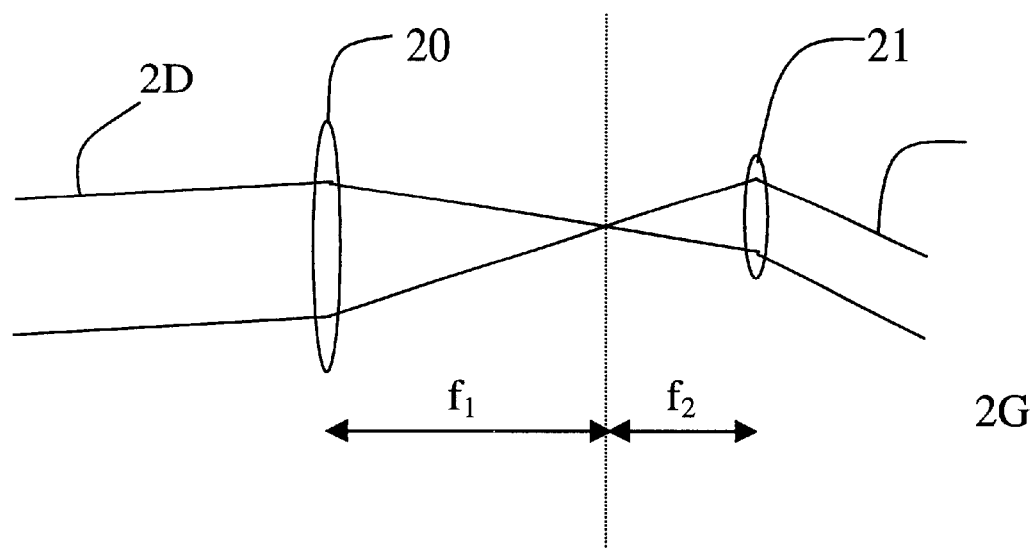
FIG. 4A is a drawing showing the optical system for increasing the scan angle and also reducing the beam spot size for the preferred embodiment of the invention.

Larger scan angle is essential for disk of larger diameter. In order to obtain a larger scan angle so that the light beam cover a larger area an additional attachment is made on the optical layout of the system. FIG. 4A shows the optical arrangement required for increasing the scan angle and also to reduce the beam spot size. The system comprises a combination of two lenses 20 and 21 of preferably positive focal length separated by a distance equal to the sum of the focal length of the two lenses. The beam 2D passes through the lens 20 and 21 which eventually results in the output beam 2G preferably of larger deflection angle and also preferably of smaller beam diameter. The output beam 2G is then made to pass through the lens 7 and thereafter takes the optical path as shown in FIG. 1. The system acts as a Keplerian telescope.

Figure 4B:
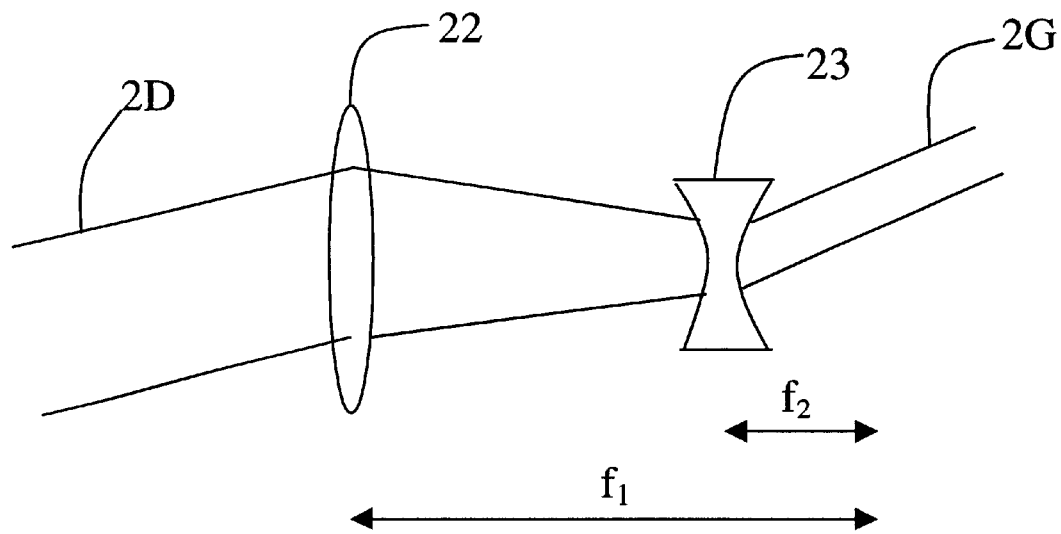
FIG. 4B is a drawing showing the compact optical system compared to the system shown in FIG. 4A for increasing the scan angle and also reducing the beam spot size for the preferred embodiment of the invention.

Another way to establish the same is as shown in FIG. 4B. This system consists of two lenses 22 and 23 preferably of positive and negative focal length. Here the two lens 22 and 23 are separated by a distance equal to the difference in the focal length of the two lenses. Thereby the system compact compared to the previous method. This system acts as a Galilean telescope. The system will lead to more compact structure than the Keplerian telescope.

Second Embodiment of the Present Invention

Figure 3A:
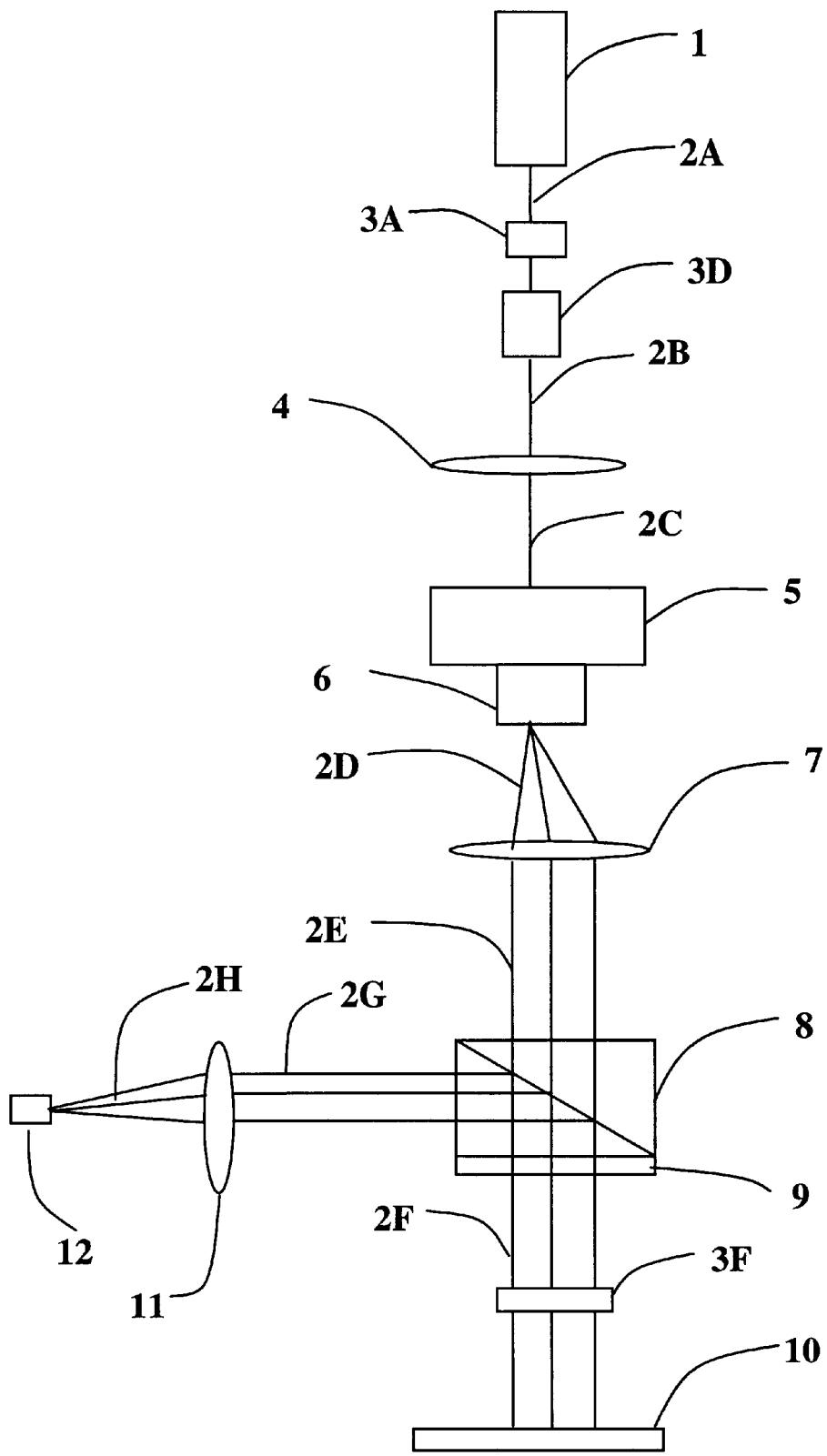
FIG. 3A is a drawing showing the optical layout for reading on the stationary optical storage media using a scanning lens with scanning beams parallel and normal to the surface of the scanning lens for the second embodiment of the present invention.
Figure 3B:
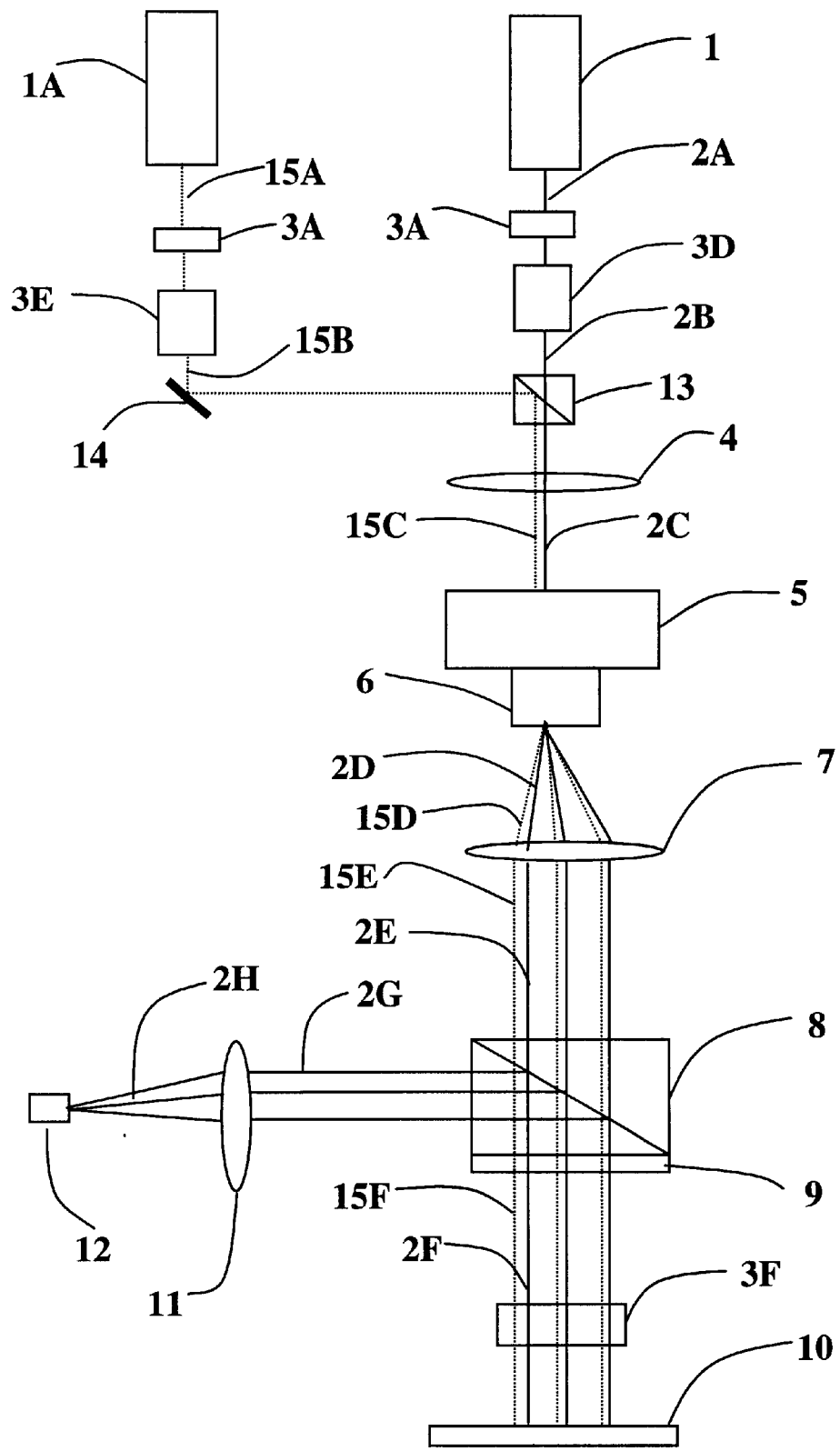
FIG. 3B is a drawing showing the optical layout for reading as well as writing on the stationary optical storage media using a scanning lens with scanning beams parallel and normal to the surface of the scanning lens for the second embodiment of the present invention.
Figure 3C:
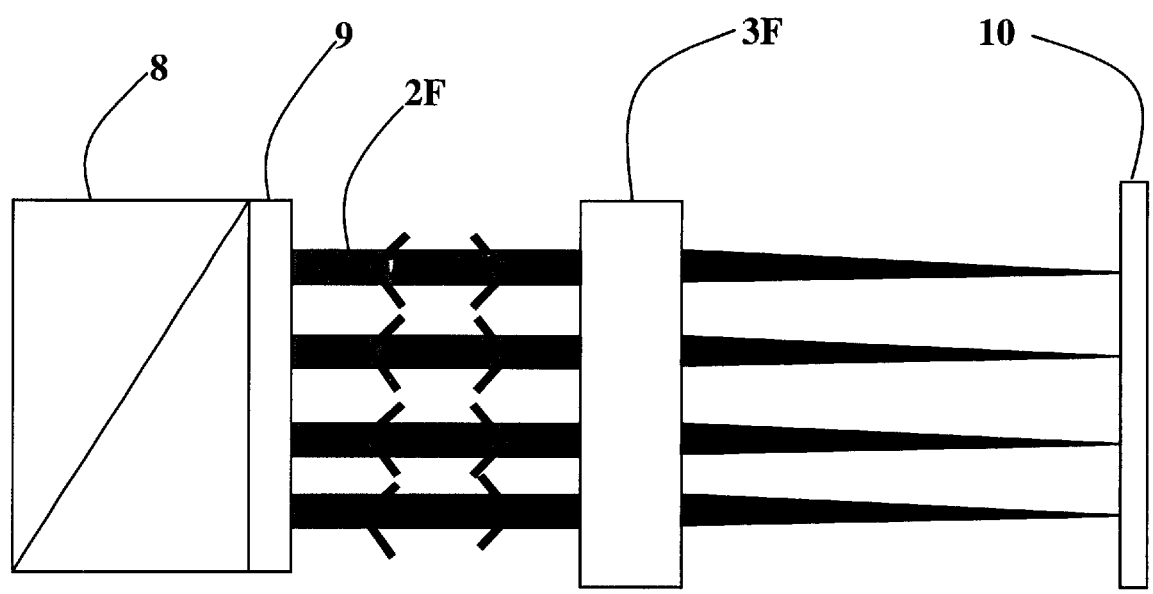
FIG. 3C is a drawing showing the detail description of the application of scanning lens in the optical system for the second embodiment of the present invention.

Referring to FIGS. 3A and 3C, the second embodiment of the present invention replaced the beam reducer 3B by a beam expander 3D. Here the beam 2A from the source 1 passes through the spatial filter 3A in order to filter the beam thereby improving its quality. The filtered beam passes through a beam expander, which is of fixed or variable beam expansion. The expanded beam then passes through the collimating optics 4 and through the acousto optic deflector 5 and 6. The deflected beam passes through the collimating lens 7, which leads to parallel scanning beam as described in the first embodiment. The beam 2E them passes through the polarizing beam splitter 8 and the wave plate, which is preferably a quarter wave plate. The scanning beam then strikes the scanning lens 3F normal to its optical axis. The purpose of the scanning lens is to focus the beam on to the disk to a very small spot size. The spot size and hence the specification of the scanning lens depends on the pitch diameter of the data written on the disk. The smaller the disk size, greater is the density of the disk and smaller is the focused beam spot size. The beam 2F emerging from the optics 8 and 9 passes through a scan lens 3B that focuses the beam on to the optical disk 10 to a very small spot size. A distance equal to the focal length of the scanning lens separates the scan lens from the disc. The beam reflected from the disk regains its beam size on passing through the scan lens 3B on its return path as shown in detail in FIG. 3C. The reflected beam passes through the scanning lens 3F, where it regains its original size and passes through the wave plate 9 which changes the polarization state of the beam. The beam is then deflected by the polarizing beam splitter 8 on to the collimating or focusing lens 11 which focuses the beam on to the photo detector 12.

Referring to FIG. 3B the system can be modified for writing and reading by employing a different laser source 1A. The writing beam 15A from the laser source 1A of higher power than the reading beam passes through the spatial filter 3A and through the beam expander 3E of greater expansion ratio than the beam expander 3D. The expanded beam 15B is deflected by the defecting mirror 14 on to the polarizing beam splitter 13. Then the beam takes the path as the reading beam and strikes the optical media on which the data is written. The purpose of the beam expander is to increase the beam size, which influence the beam spot size on the optical writing media 10 on passing through the scanning lens 3F. The larger the beam expanded by the beam expander by proving a larger beam expansion ratio, the smaller will be the spot size. Also the wavelength of the beam affects the beam spot size. Smaller the wavelength of the beam smaller will be the spot size. The beam expansion and the wavelength of the beam are chosen depending on the spot size requirement. Alternatively the same source can also be employed for reading as well as writing when the source has the capability to vary the intensity of the beam. If the beam expander 3D used is of variable expansion capability the beam can be expanded to different ratio for reading and writing. For writing the expansion is higher compared to reading in order to achieve a smaller spot size.

Third Embodiment of the Present Invention

Figure 5A:
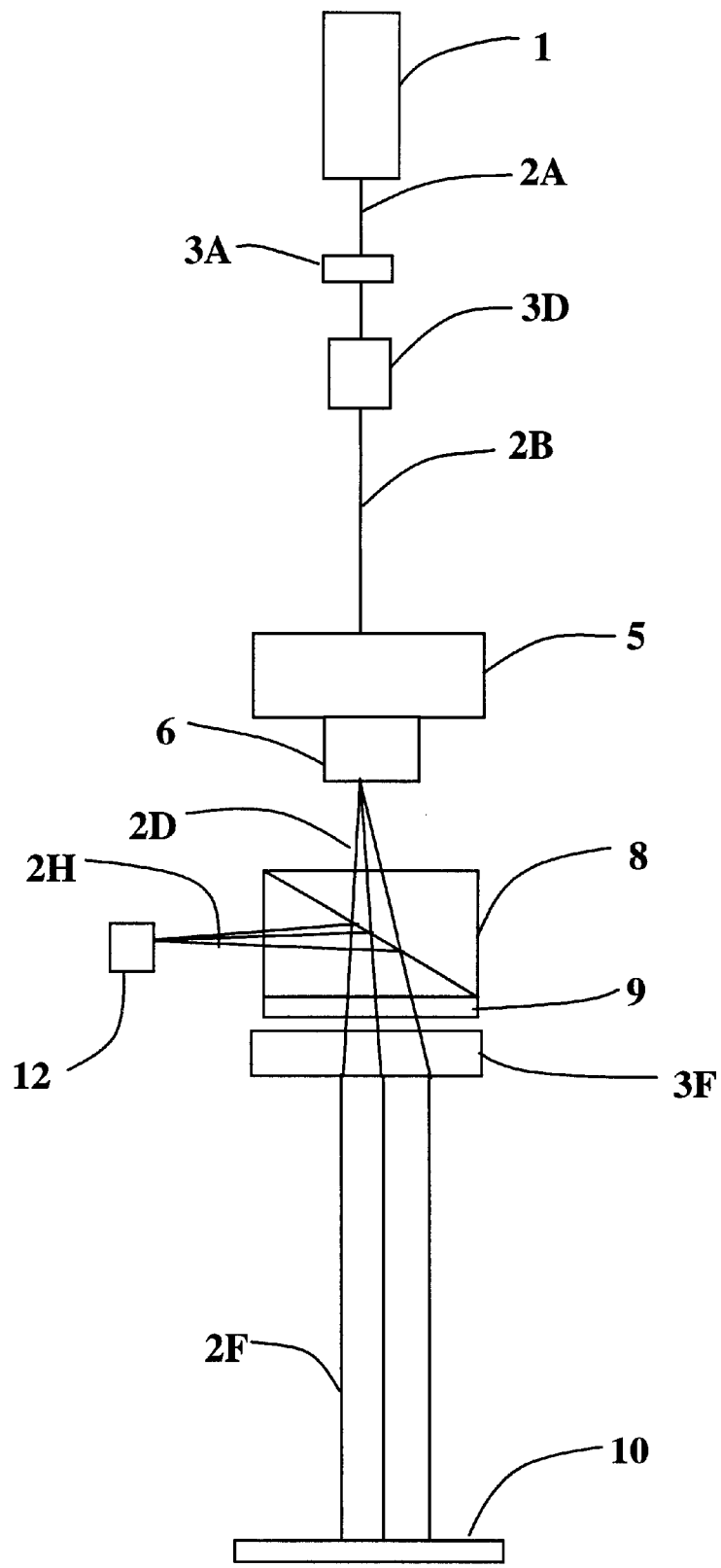
FIG. 5A is a drawing showing the optical layout for reading on the stationary optical storage media using a scanning lens with scanning beams scanning at an angle from the same point onto the surface of the scanning lens for the third embodiment of the present invention.

Referring to FIG. 5A the beam 2A from the source 1 passes through preferably a spatial filter 3A, which filters and improves the quality of the beam. The filtered beam passes through a beam expander 3D of fixed or variable beam expansion type. The expanded beam 2B passes through the acousto optic deflector 5 and 6, which deflects the beam on two axes. The deflected scanning beam passes through the beam splitter 8, which is preferably a polarizing beam splitter and a wave plate 9, which is preferably a quarter wave plate. The scanning beam strikes the scanning lens 3F, which deflect the beam, such that the scanning beam 2F strikes nearly normal to the optical recording media surface 10. The beam also focus on to the recording media 10 to a small spot size. The accuracy to which the scanning beam 2F strikes normal to the surface of the recording media 10 can be improved by varying the type of scanning lens used. Scanning lens such as F-Theta lens, Telecentric lens, Confocal microscopy lens etc can be applied for the current application. The beam 2F gets reflected from the optical storage media 10 and passes back through the scanning lens 3F and the wave plate 9. The beam splitter 8 then deflects the beam. The scanning beam 2H then arrives at the same point on the photo detector 12 without using a collimating optics. The collimating or focusing optics may also be used in order to focus the beam on to a small spot size depending on the optical window of the photo detector. The distance between the scanning lens 3F and the recording media 10 is equal to the focal length of the scanning lens 3F. By using the current system the number of optical components are considerably reduced.

Figure 5B:
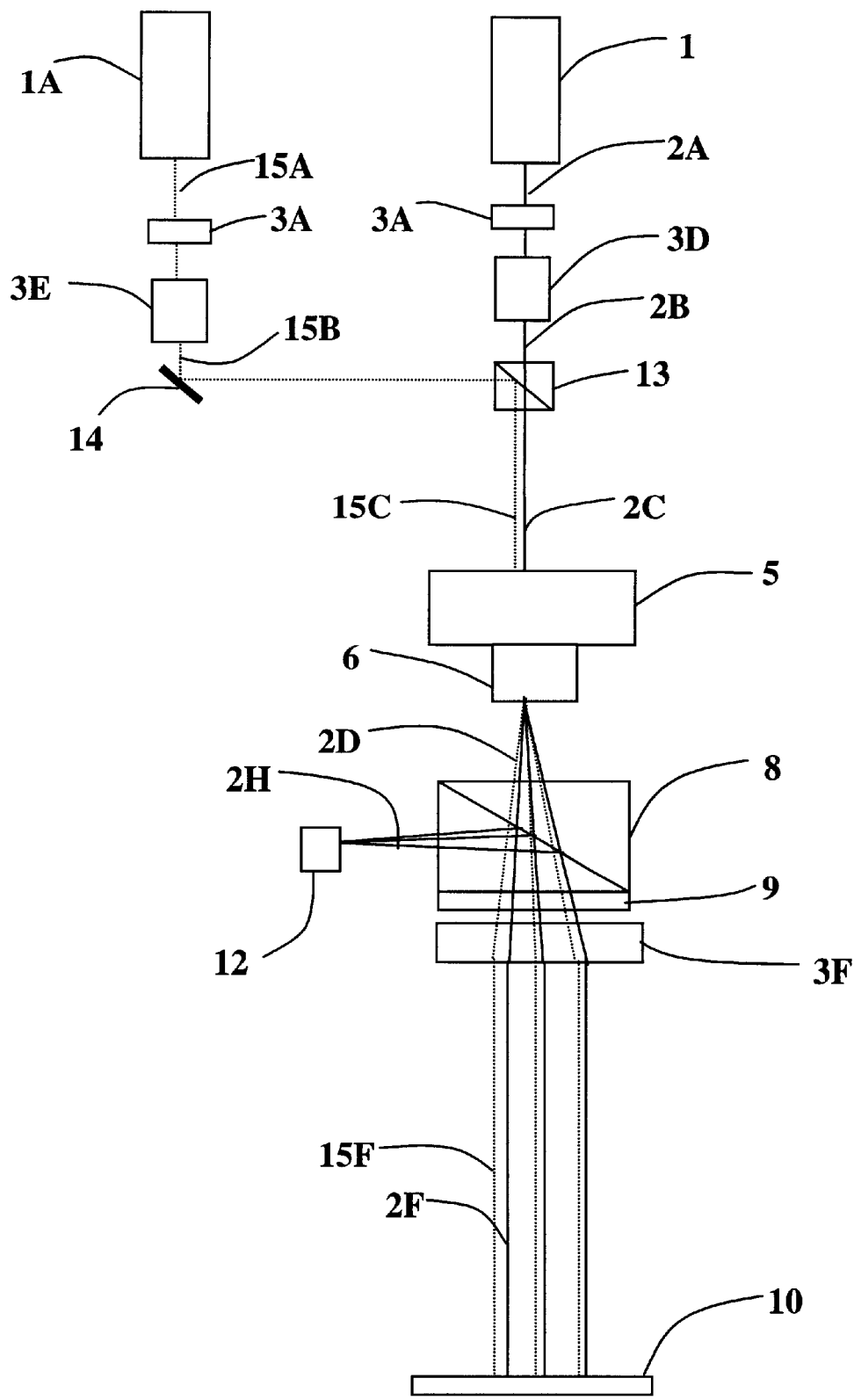
FIG. 5B is a drawing showing the optical layout for reading as well as writing on the stationary optical storage media using a scanning lens with scanning beams scanning at an angle from the same point onto the surface of the scanning lens for the third embodiment of the present invention.
Figure 5C:
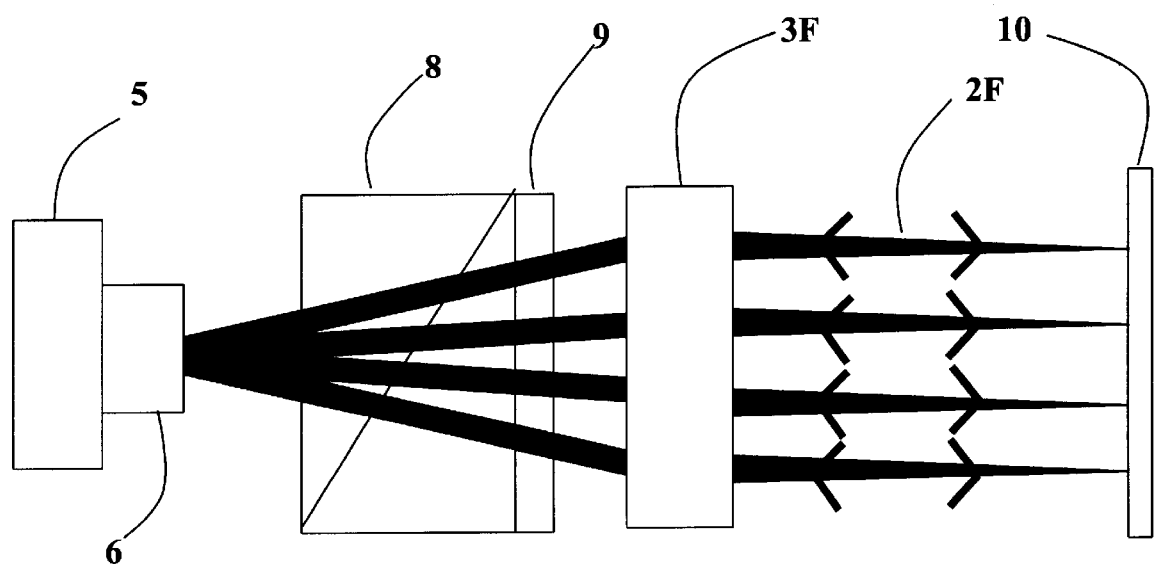
FIG. 5C is a drawing showing the technique of scanning using the scanning lens for the third embodiment of the present invention.

Referring to FIG. 5B the system can be modified for writing and reading by employing a different laser source 1A. The writing beam 15A from the laser source 1A of higher power than the reading beam passes through the spatial filter 3A and through the beam expander 3E of greater expansion ratio than the beam expander 3D. The expanded beam 15B is deflected by the defecting mirror 14 on to the polarizing beam splitter 13. Then the beam takes the path as the reading beam and strikes the optical media 10 on which the data is written. The purpose of the beam expander is to increase the beam size, which influence the beam spot size on the optical writing media 10 on passing through the scanning lens 3F. FIG. 5C shows the detail description of the scanning technique involved in the current embodiment.

In all the embodiments the laser beam can be pulsed for writing by controlling the driver of the acousto optic deflector. Here the beam is pulsed by varying the intensity of the scanning beam. Also the beam can be pulsed by applying a additional acousto optic modulator next to the beam source to pulse the laser beam accordingly.

In all the embodiments the need for focusing mechanism may preferably be eliminated in the disclosed invention due to the stationary nature of the disk and the non-mechanical movement of the optical head. Thus the servo control mechanism involved in the system is simplified by employing the acousto optic deflector for scanning mechanism.

In all the embodiments the Size of the disk that can be employed in the system depends on the distance between the acousto optic deflector and the disk surface. The larger the disk the longer the distance between the acousto optic deflector and the disk Surface. Since the resolution of scanning is high and the beam spot size is less, smaller disk can be employed, which reduces the distance between the acousto optic deflector and the disk Surface. Thus by employing a smaller disk the size of all the optical components involved in the system is reduced, making the system compact.

Figure 6A:
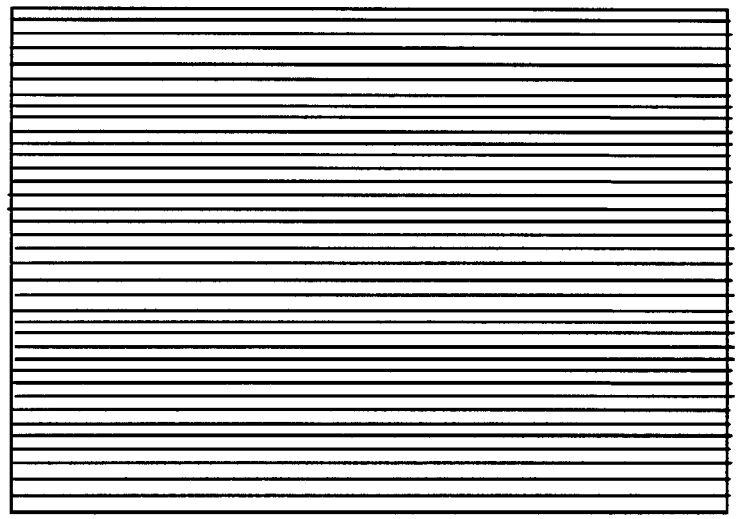
FIG. 6A shows the modified form of disk to square shape for the preferred embodiment of the invention.
Figure 6B:
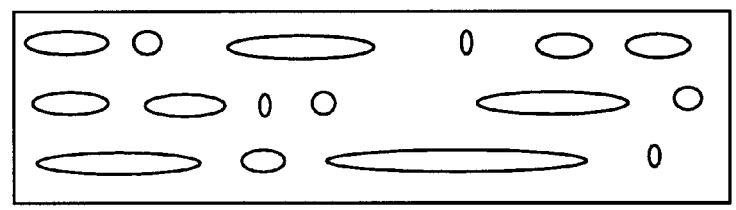
FIG. 6B shows the writing or reading of data in a liner fashion in a square disk for the preferred embodiment of the invention.
Figure 6B:
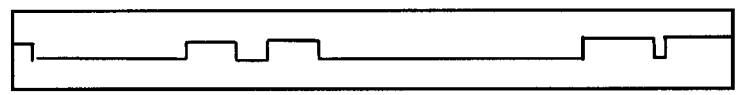
Figure 8:
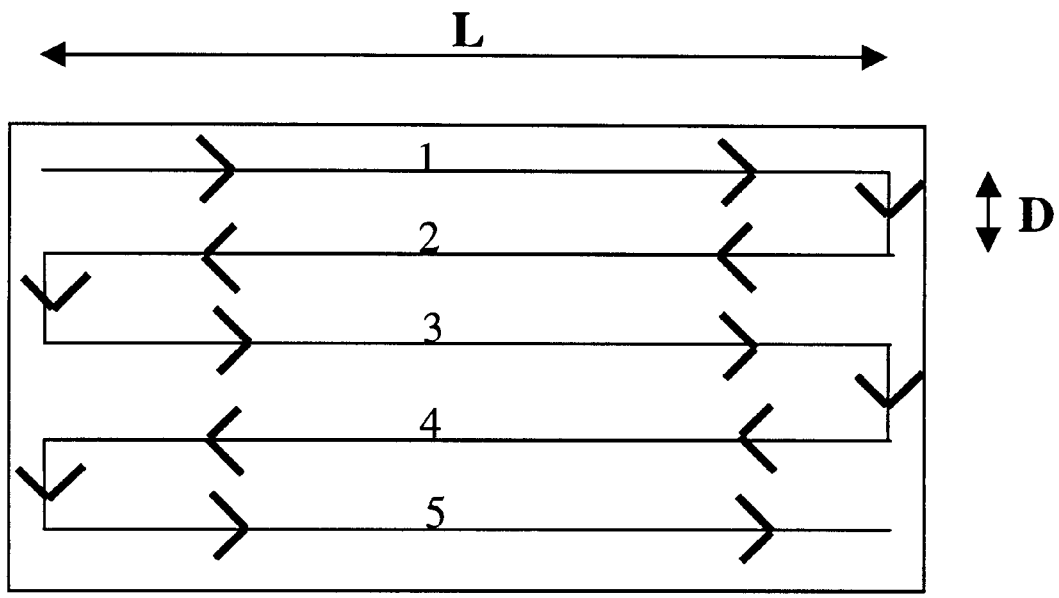
FIG. 8 is a drawing showing the step scanning mechanism involved on scanning a square optical storage disk for the preferred embodiment of the invention.
Figure 9:
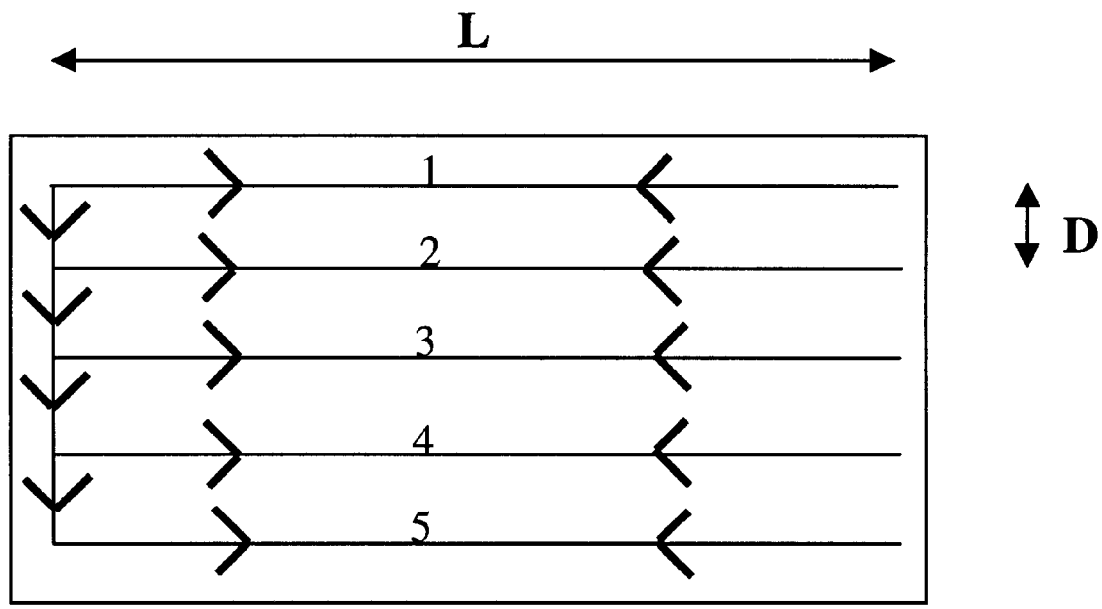
FIG. 9 is a drawing showing the alternative step scanning mechanism involved on scanning a square optical storage disk for the preferred embodiment of the invention.

In all the embodiments the disk shape can be modified to square or circular shape. Since the need for rotating the disk is eliminated the need for central slot may not be required. This eventually results in the reduction of the disk size. Also a square disk as shown in FIG. 6A can replace the circular disk. In square disk the circular scanning is replaced by linear scanning, which has a simpler scanning control of the beam. Here, data is written in a linear fashion rather than in a circular pattern as shown in FIG. 6B. The scanning mechanism can be of two types. Referring to FIG. 8, the beam scans along the path 1 and at the end of the scan length L the beam is stepped by a prescribed distance D which is the track pitch in the perpendicular direction of scan. Now the beam is scanned in the reverse direction along the path 2 and on reaching the end of scan, the beam is again stepped by the distance D. The beam is now scanned along the path 3 in the same direction as in path 1. The process is repeated over the entire disk as the data is written along the paths 1, 2, 3, etc. The Alternative way of scanning the square disc is as shown in FIG. 9. The beam is scanned along the path 1 for the scan length L where it reads or writes data. On reaching the end of the scan length, the beam returns in the same path 1. On the return journey of the beam data is not read or written. The beam on reaching the start point is stepped by a distance D, the track pitch in the perpendicular direction to that of the scanning path 1. The beam then scans along the path 2 and the process are repeated. This scanning mode will employ a much more simplified control mechanism in comparison to the previous scanning method.

Figure 7A:
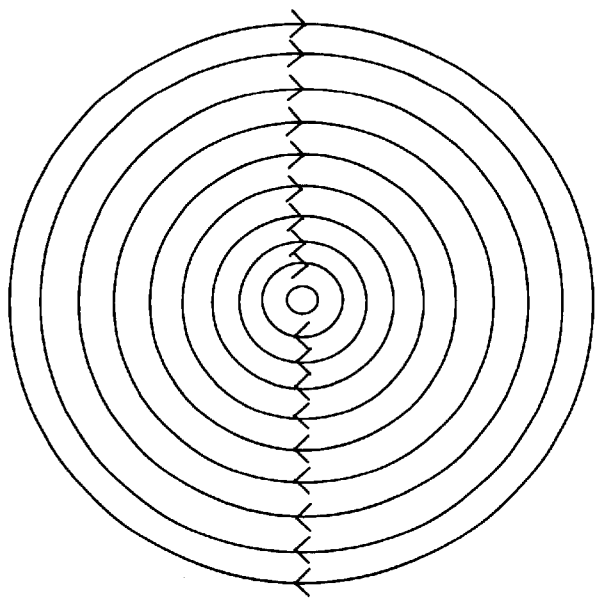
FIG. 7A shows the writing or reading of the data in a circular fashion for the preferred embodiment of the invention.
Figure 7B:
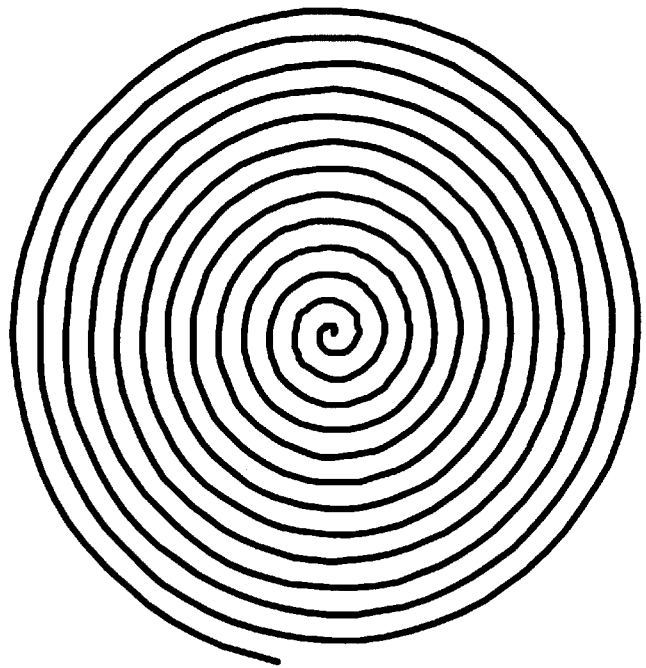
FIG. 7B shows the writing or reading of the data in a spiral fashion for the preferred embodiment of the invention.

Similarly in a circular disk the data can be written preferably in a circular fashion or in a spiral manner. In the modified disk of the present invention the need for central fixing or holding space is eliminated and is occupied by data storage, thereby minimizing the disk size. A central location pin or any other location mechanism may probably be the only requirement. In the method of writing data in a circular fashion is as shown in FIG. 7A, the beam is stepped by a distance of track pitch on completion of the entire circular scanning. The alternative way is the spiral scanning as shown in FIG. 7B where the beam is scanned spirally and the data is written or read accordingly.

In all the embodiments the size of the disk can be reduced, which may preferably also reduce the access time. The process of reducing the disk size and simultaneously increase the density of the disk implies a reduced size for the beam and also an enhanced resolution for scanning. The reduction in beam size is directly related to the resolution of beam scanning. The smaller the beam size and higher the resolution the smaller a disk can be made. A beam reducer employs a combination of lenses with large focal length and small focal length, to reduce the size of the beam.

Figure 10:
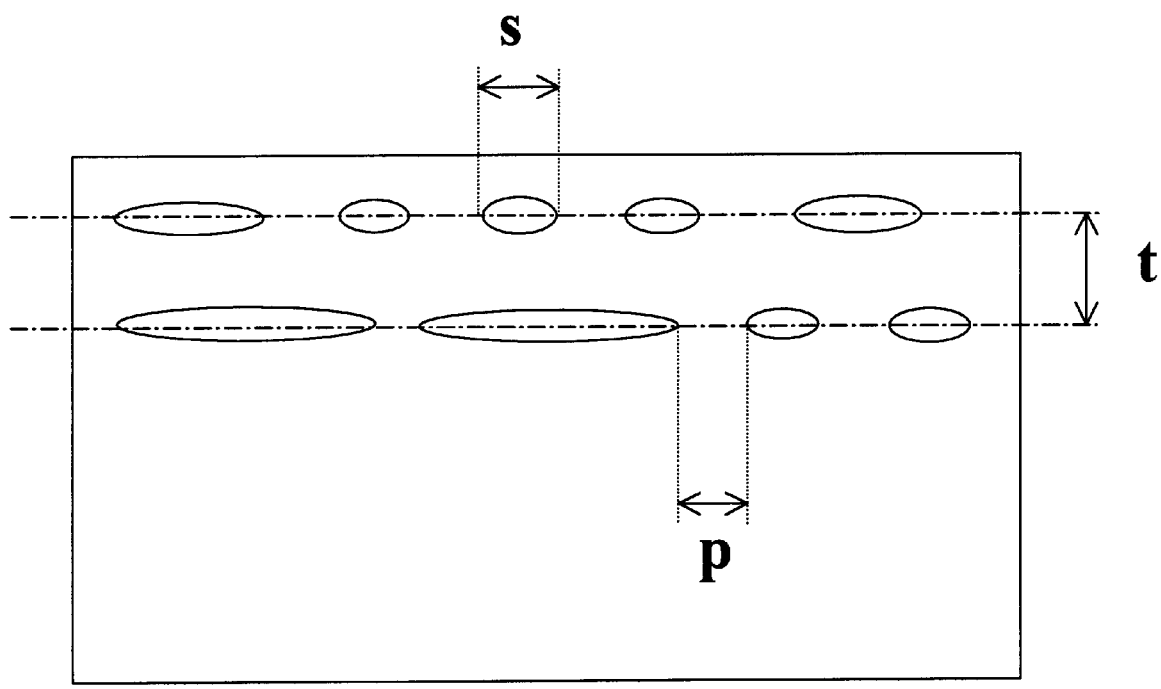
FIG. 10 is a drawing showing the dimension of the written data on the optical storage media for the preferred embodiment of the present invention.

To reduce the access time the scanning speed of the beam is increased. Referring to FIG. 10 the pit distance is given by p and distance between the track, the track pitch is given by t and the diameter of each spot or pit length is given by s. By increasing the resolution of scanning and reducing the beam spot size, the distance p, s, t can be reduced. Since the system involves no mechanical movement of the disk or the head very high resolution can be achieved, which can reduce the size of the disk or increase the data storage capacity of the disk.

Figure 11:
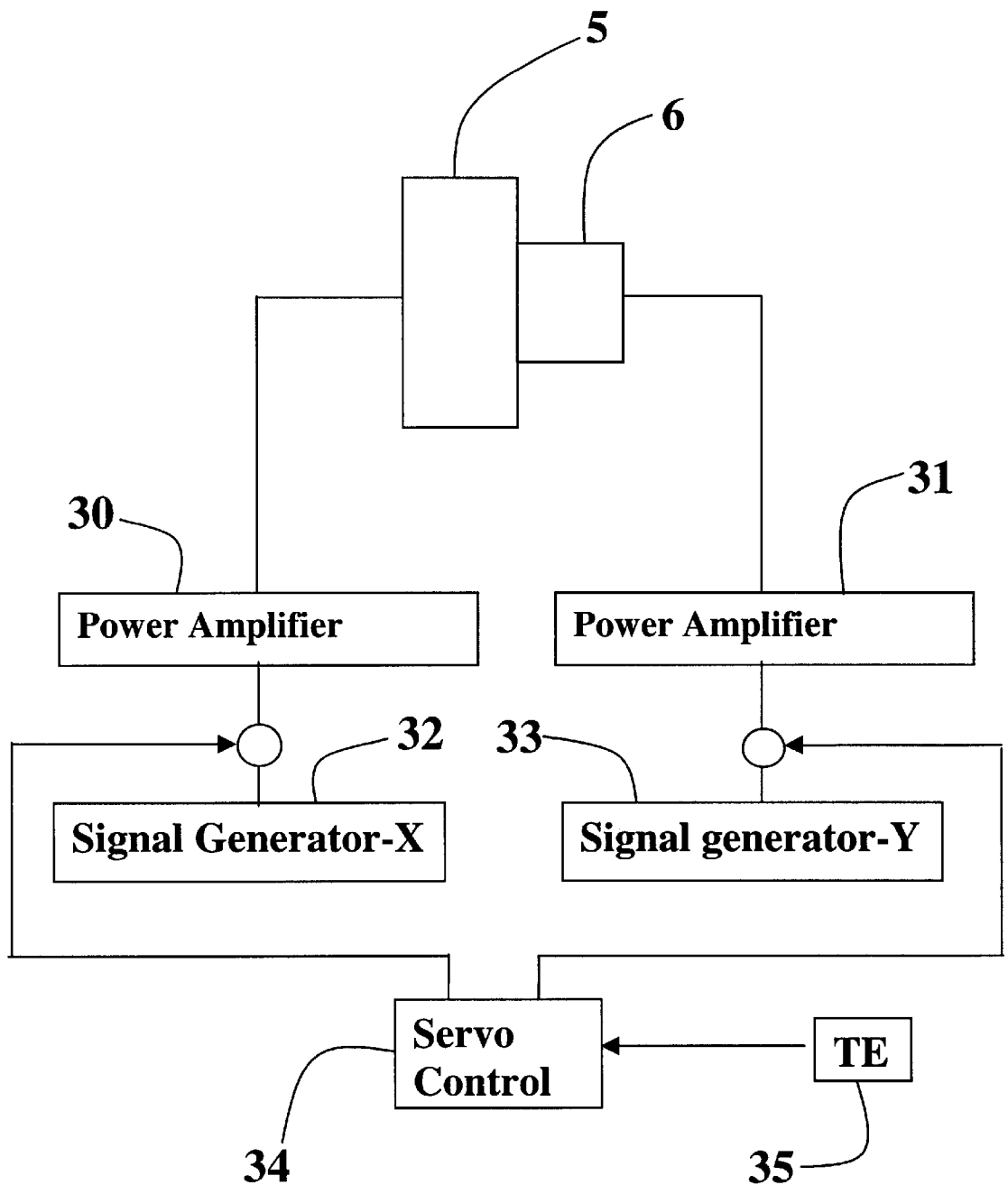
FIG. 11 is a schematic layout of the control mechanism for the acousto optic deflector for the preferred embodiment of the invention.

Referring now to FIG. 11, the two acousto optic deflectors 5 and 6 are positioned perpendicular to each other for x-axis and y-axis scanning. Also the acousto optic deflector 6 is preferably at Brag's angle to the acousto optic deflector 5. The control system for the acousto optic deflector is as shown in FIG. 11. The Frequency signal from the signal generator-X 32 is amplified in power by the power amplifier 30. The amplified signal is inputted to the acousto optic deflector 5. Similarly the frequency signal from the signal generator-Y 33 is amplified in power by the power amplifier 31. The amplified signal is inputted to the acousto optic deflector 6. The acousto optic deflector comprises of an acoustic crystal where acoustic wave is generated on supplying frequency signal to the transducer fixed to the crystal. The acoustic wave acts as a moving grating and deflects the beam to a prescribed angle depending on the frequency input and type of crystal involved, and the velocity of the acoustic wave. Therefore, by varying the frequency input to the acoustic crystal the deflection angle of the crystal is varied and hence the beam is made to scan. The input frequency to the acousto optic deflector is the only controlling parameter involved in the system, which simplifies the system.

Figure 12:
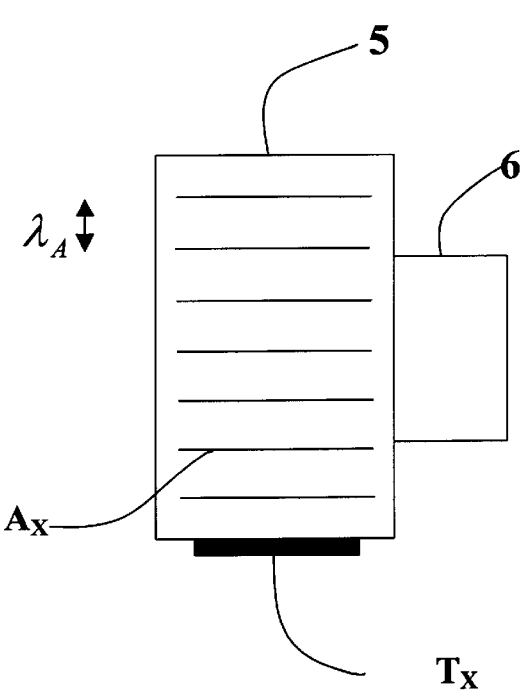
FIG. 12 is a schematic view of the acousto optic crystal in the acousto optic deflector for the preferred embodiment of the invention.

The detailed description of the acousto optic deflector involved in the system is as shown in the FIG. 12. $T_x$ is the transducer fixed to the acoustic crystal 5. A signal generator drives the transducer. When a frequency signal is given to the transducer $T_x$, the electrical signal is converted to an acoustic wave $A_x$. The acoustic wave travels away from the transducer and is damped at the other end to prevent back reflection of the acoustic wave. The acoustic wave $A_x$ has a frequency equal to the frequency input to the transducer. The spacing between the acoustic wave or the wavelength of the acoustic wave $\lambda_A$ depends on the frequency input to the transducer $T_x$ and the velocity of the acoustic wave is constant for a given material.

Figure 13:
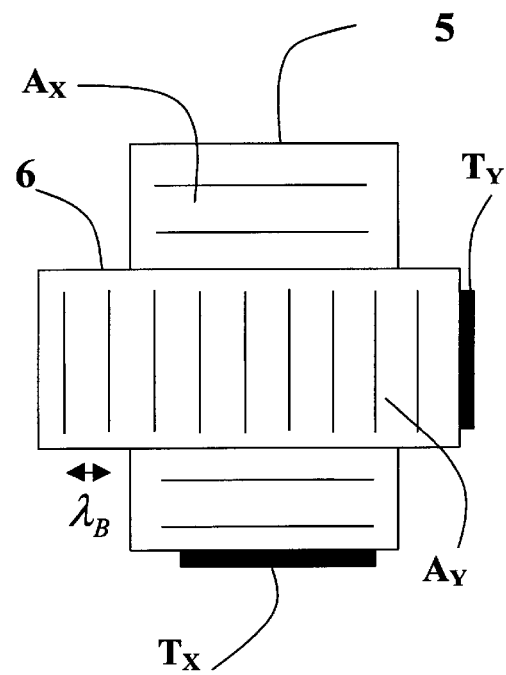
FIG. 13 is a schematic view showing the orientation of the two acousto optic crystal for scanning the beam on two axis for the preferred embodiment of the invention.

The acousto optic deflector 6 is placed such that the acoustic wave in the acousto optic deflector 5 is perpendicular to the acoustic wave in the acousto optic deflector 6 as illustrated in FIG. 13. $T_y$ is the transducer fixed to the acoustic crystal 6. A signal generator drives the transducer. When a frequency signal is given to the transducer $T_y$, the electrical signal is converted to acoustic wave $A_y$. The acoustic wave travels away from the transducer and is damped at the other end to prevent back reflection of the acoustic wave. The acoustic wave $A_y$ has a frequency equal to the frequency input to the transducer. The spacing between the acoustic wave or the wavelength of the acoustic wave $\lambda_B$ depends on the frequency input to the transducer $T_y$ and the velocity of the acoustic wave is constant for a given material.

Figure 14:
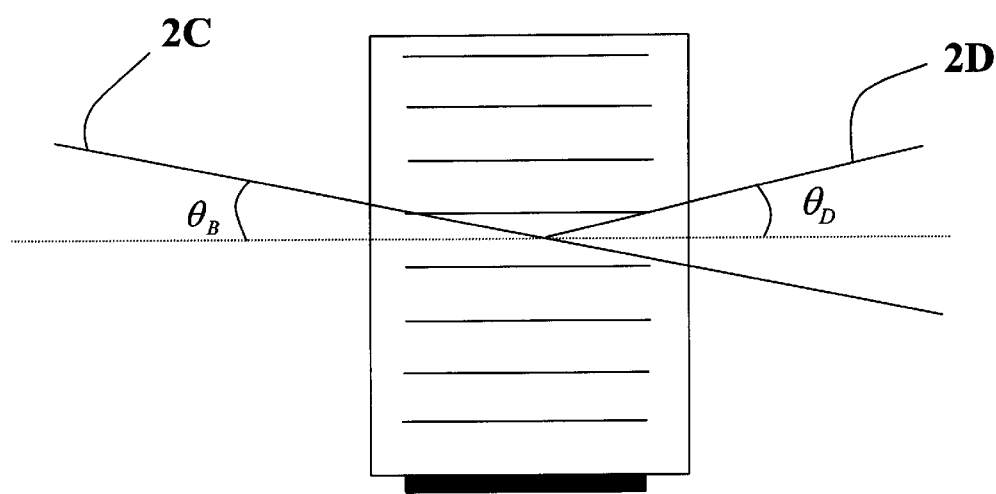
FIG. 14 is a schematic view of the acoustic crystal showing the angle of beam incidence and the deflection angle of the beam.

When the beam 2C enters the acoustic crystal at Brag's angle $\theta_B$, a deflected beam is obtained at an angle $\theta_D$. Since the deflection angle $\theta_D$ depends on the wavelength of the acoustic wave, independent deflection angle is thus obtained for each of the frequency input as illustrated in FIG. 14. Thus by controlling the frequency input to the two acousto optic deflectors 5 and 6 the bean can be scanned in two axis to any required point. The maximum defection angle depends on the bandwidth of the acousto optic deflector. The resolution of scanning depends on the number of distinguishable frequency inputs that can be obtained.

Any one of the techniques such as push-pull, phase detection, wobble, sample servo may detect the tracking error. The tracking error 35 is inputted to the servo controller, which in turn generates the tracking offset to the signal generator X 32 and signal generator Y 33.

Fourth Embodiment of the Present Invention

Figure 15:
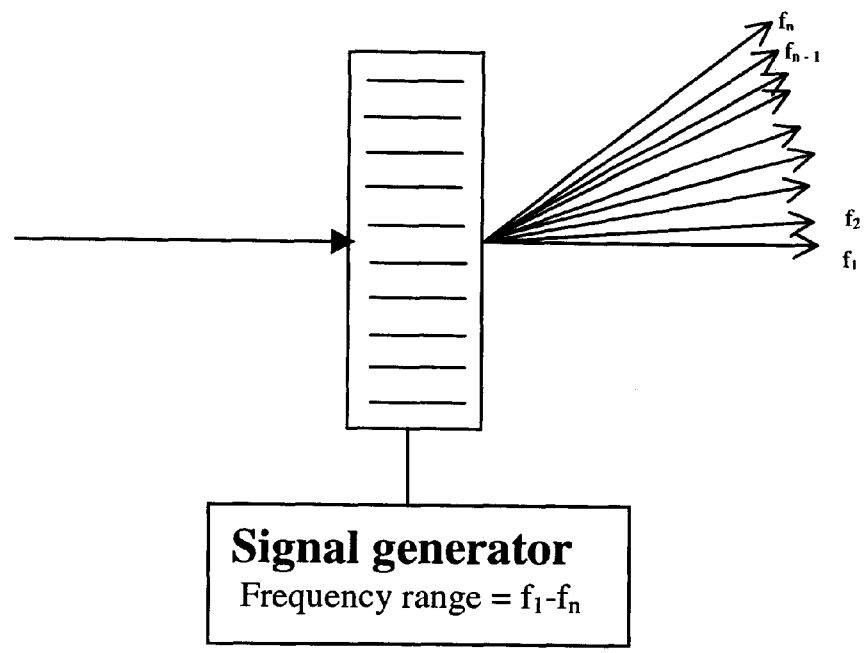
FIG. 15 is a drawing showing the independent deflection angle of the beam for each of the input frequency to the acousto optic deflector.
Figure 16:
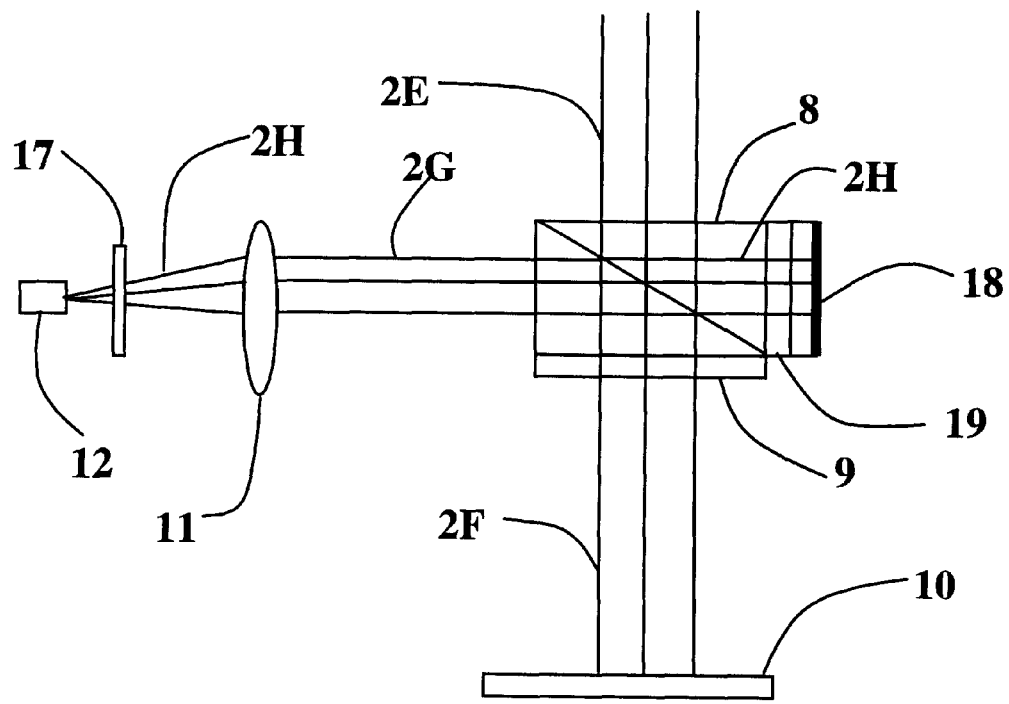
FIG. 16 is a drawing showing the optical layout for reading the data by phase shifting technique for the fourth embodiment of the present invention.

The fourth embodiment of the present invention is the employment of a phase shifting technique, which measures the shift in phase of the beam to identify the signal instead of measuring the intensity of the beam. Once the phase shifting technique is employed the need for detecting the tracking error is eliminated. The modification of the system to phase shifting technique is as shown in FIG. 15. The beam 2E is circularly polarized rather than linearly polarized. The beam splits in to two orthogonal polarized beams 2H and 2F. The beam 2F as in the first embodiment pass through the wave plate 9, preferably a quarter wave plate and strikes the disk 10 and reflects back. The beam 2F on passing through the wave plate 9 on the return path, thereby changing the polarization of the beam and hence the beam is reflected by the polarizing beam splitter 8 towards the photo detector 12. The beam 2H passes through a wave plate 19, preferably a quarter wave plate and strikes a plane mirror 18. The beam 2H is then reflected by the mirror 18 and passes through the wave plate 19 on its return path. Thereby the polarization state of the beam is changed and hence the beam passes through the polarizing beam splitter 8. Thus, the two beams 2H and 2F overlaps to form the beam 2G. The beam 2G passes through a focusing lens 11 on to the photo detector 12. A polarizer 17 is placed in front of the photo detector 12 so that the beam 2G comprising of the two orthogonal-polarized beams interferes. Based on the phase shift of the interference signal the data can be read. Also the need for tracking system can be eliminated since the phase shifting technique can replace the tracking technique available.

Other scanning technique such as piezo driven scanning mirror etc can be employed replacing the acousto optic deflector but the control of the system is more complicated. Also it is comparatively difficult to reduce the disc size due to the vibration if the scanning mirror which will degrade the resolution of scanning. Moreover, the scanning speed is also limited by the increase in the vibration error with scanning speed and hence results in limited data access rate.

For all the embodiments for writing either the beam source 1 can be pulsed or a continuous beam from the laser source can be pulsed by having an external acousto optic modulator. The acousto optic modulator is placed in front of the beam source 1 and is pulsed accordingly by varying the intensity of the first order beam or higher order beam depending on the beam employed for writing. Also, the pulsing can be carried out by controlling the intensity of the acousto optic modulator 5 or 6 which eliminates the need for addition pulsing modulator in front of the beam source 1.

Advantages of the System over the Current Techniques

The present invention has several advantages over the prior art for reading and writing on a optical disk are. Since all the mechanical movement including the rotation of the disk is eliminated due to the scanning mechanism disclosed in the invention. By making the disk stationary the tolerance in the optical storage system is reduced to a large extent. Since the tolerance in the system is very less, the data can be written on the storage media in a very small area compared to the ordinary storage system. This will eventually reduce the size of the disk. The employment of acousto optic device for beam scanning simplifies the control system employed for scanning the beam, which is simple, compared to the control system employed for the actuator movement. The restriction imposed on the actuator such as reduction in size of the optical head assembly, micro lens fabrication and other micro feature fabrication is eliminated. The need for employing a circular disk is eliminated since there is no rotation involved in the system. The disk shape can thus be modified to square or even other shapes depending on the ease of manufacturing, cost and the requirement.

The resolution of the beam movement is very high compared to that obtained from the actuator movement. This will be an added advantage in reducing the size of the disk in addition to the reduction in tolerance, due to the elimination of wobbling of disk on rotation. Moreover the density of the disk can be increased for the same disk size. Both the density and the disk size depend on the smallest beam spot size and the highest resolution achievable in the system. The sweeping rate of the beam can be increased which will result in increase of the rate of data retrieval. Thus the time taken for the data retrieval is reduced. The problem of focusing is eliminated due to the employment of stationary disk. Thus the complexity of the system is reduced due to the removal of the focusing technique employed in current system working on actuator principle. Although the tracking technique may be employed in the current technique but the tracking error is not so complex as in the system working on actuators.

What is claimed is:

1. A method for reading and writing data on a stationary optical storage medium, comprising the steps of:
   emitting from a stationary coherent source of light a collimated beam of light having a predetermined wavelength and frequency;
   deflecting the beam with at least two acousto optical deflectors on at least two axes to generate parallel scanning beams, the light from the parallel scanning beams perpendicularly striking the surface of the stationary optical storage medium and scanning the entire surface of the optical storage medium; and
   capturing the reflected beams from the surface of the optical storage medium with a photodetector, which detects the stored information.

2. A method of reading and writing on a stationary optical storage medium in accordance with claim 1 which further includes reducing the size of the beam from the beam source.

3. A method of reading and writing on a stationary optical storage medium in accordance with claim 1 which further includes driving the two acousto optic deflectors for two axis scanning.

4. A method of reading and writing on a stationary optical storage medium in accordance with claim 1 which further includes scanning the beam in two axes with:
   at least one acousto optic deflector for X-axis scanning and a second acousto optic deflector for Y-axis scanning;
   acousto optic modulators mounted such that the acoustic waves in the acousto optic deflectors are perpendicular to each other;
   the orientation of the two acousto optic deflectors is such that the deflected beam from the preceding acousto optic deflector strikes the acoustic wave in the succeeding acoustic crystal at Brag's angle; and
   a control system for both X-axis and Y-axis scanning which controls the frequency input to the acousto optic deflector.

5. A method of reading and writing on a stationary optical storage medium in accordance with claim 1 further including obtaining collimated parallel scanning beam having minimum divergence over the entire optical path.

6. A method of reading and writing on a stationary optical storage medium in accordance with claim 1 further including directing the collimated scanning beam onto the surface of the optical storage media to strike the surface as a series of parallel scanning beams perpendicular to the surface.

7. A method of reading and writing on a stationary optical storage medium in accordance with claim 1 further including directing the beam onto the photo detector.

8. A method of reading and writing on a stationary optical storage medium in accordance with claim 1 further including focusing the beam onto the surface of the optical storage medium by using a scanning lens.

9. A method of reading and writing on a stationary optical storage medium in accordance with claim 1 which further includes an optical storage medium having either a circular or square shape.

10. A method of reading and writing on a stationary optical storage medium in accordance with claim 1 further includes writing or reading data from a square or circular disk.

11. A method of reading and writing on a stationary optical storage medium in accordance with claim 10 further including spiral scanning or linear stepped scanning depending on the shape of the optical storage medium.

12. A method of reading and writing on a stationary optical storage medium in accordance with claim 1 further including increasing the deflection angle of the beam by the combination of two lens of small and large focal length or a combination of two lens of positive and negative focal length.

13. A method of reading and writing on a stationary optical storage medium in accordance with claim 1 further including writing on the optical storage medium with:
   at least two independent beam source, one for reading and the other for writing;
   the writing beam having a higher power compared to the reading beam source;
   at least two independent beam reducers of smaller beam diameter for the write beam than the reading beam; or the two beam reducer can be replaced by two different scan lens of different focusing spot size, the smaller one for the write beam and the larger one for the reading beam; the two beams following the same optical path except for the optical lenses such as the beam reducer and scan lens; and
   a single beam source having the capability of switching laser power can replace the two source for writing and reading.

14. A method of reading and writing on a stationary optical storage medium in accordance with claim 1 which further includes controlling the scanning parameter of the scanning beam.

15. A method of reading and writing on a stationary optical storage medium in accordance with claim 1 which further includes varying the scanning speed of the beam.

16. A method of reading and writing on a stationary optical storage medium in accordance with claim 1 which further includes reading the data on the disk based on the phase shift rather than on the intensity shift including: measuring with an interference mechanism the laser beam reflected from the storage medium with a reference beam from a reference mirror surface; detecting the phase shift induced; and interpreting the data based on the phase shift induced with a signal processor.

17. A method of reading and writing on a stationary optical storage medium in accordance with claim 1 which further includes pulsing the beam for writing by providing a acousto optic modulator in front of the laser source for varying the intensity of the first order beam.

18. A method of reading and writing on a stationary optical storage medium in accordance with claim 1 which further includes pulsing the laser beam by varying the intensity of the scanning beam from the acousto optic deflector.

19. A method of reading and writing on a stationary optical storage medium in accordance with claim 1 which further includes employing the method in the making of an optical disk.

* * * * *